United States Patent [19]
Woo

[11] Patent Number: 5,534,804
[45] Date of Patent: Jul. 9, 1996

[54] CMOS POWER-ON RESET CIRCUIT USING HYSTERESIS

[75] Inventor: Ann K. Woo, Cupertino, Calif.

[73] Assignee: Advanced Micro Devices, Inc., Sunnyvale, Calif.

[21] Appl. No.: 387,688

[22] Filed: Feb. 13, 1995

[51] Int. Cl.$^6$ ............................................. H03K 19/0948
[52] U.S. Cl. ........................... 327/143; 327/205; 326/27
[58] Field of Search ................................ 327/142, 143, 327/205, 206; 326/24, 27, 98, 121

[56] References Cited

U.S. PATENT DOCUMENTS

| | | | |
|---|---|---|---|
| 4,409,501 | 10/1983 | Eickerman et al. | 327/143 |
| 4,506,168 | 3/1985 | Uya | 327/206 |
| 4,539,489 | 9/1985 | Vaughn | 327/206 |
| 4,970,408 | 11/1990 | Hanke et al. | 327/143 |
| 4,983,857 | 1/1991 | Steele | 327/143 |
| 5,136,181 | 8/1992 | Yukawa | 327/143 |
| 5,334,883 | 8/1994 | Rosenthal | 327/206 |
| 5,349,244 | 9/1994 | Confalonieri | 327/143 |
| 5,440,255 | 8/1995 | Fournel | 327/143 |

*Primary Examiner*—Edward P. Westin
*Assistant Examiner*—Benjamin D. Driscoll
*Attorney, Agent, or Firm*—Davis Chin

[57] ABSTRACT

A CMOS power-on reset circuit for generating a reset signal in response to the activation of a power supply includes a voltage clamping stage (14) and a hysteresis switching stage (16). The voltage clamping stage (14) is formed of an N-channel resistor (M1), a first resistor (R1), and a second resistor (R2). The hysteresis switching stage (16) includes a P-channel pull-up transistor (M2), a first N-channel pull-down transistor (M3), a current-source transistor (M4), a second N-channel pull-down transistor (M5), and an inverter (G1).

10 Claims, 1 Drawing Sheet

CMOS POWER-ON-RESET CIRCUIT

CMOS POWER-ON-RESET CIRCUIT 5,534,804

CMOS POWER-ON RESET CIRCUIT USING HYSTERESIS

BACKGROUND OF THE INVENTION

This invention relates generally to power-up reset circuits and more particularly, it relates to an improved CMOS power-on reset circuit which includes hysteresis switching means for turning off a reset signal when a first predetermined trip level has been reached and for turning on the reset signal when a second predetermined trip level has been reached and which is lower than the first predetermined trip level.

In a variety of CMOS or bipolar digital integrated circuit devices, such as flip-flops, latches, counters, memory state registers and the like, the outputs thereof can have two or more stable states. It is often desirable to initialize or reset these types of logic and/or memory circuits to a particular known logic state prior to their normal operation every time when power is first applied (i.e., "power-up"). As is generally well-known, this initialization process is commonly achieved by a reset signal generated by a power-on reset circuit which is applied for a brief period of time when the power supply voltage is ramping up so as to reset or initialize the outputs of the digital integrated circuit devices. Accordingly, this proper initialization ensures the operating state of the various logic and/or memory circuits in the digital integrated circuit devices as well as simplifies test procedures to be performed on them. This reset signal is then switched off after the power supply voltage exceeds a predetermined level, which is below the normal power supply voltage.

However, in the event of a transient noise occurring after the power supply voltage has exceeded the predetermined level but while it is still ramping up, this will cause the disadvantage of generating an unwanted reset signal which tends to interfere with the normal operation of the digital integrated circuit devices.

It is generally desirable to prevent the generation of the reset signal due to this transient noise in order that the digital integrated circuit devices are maintained in the functional state and to permit the generation of the reset signal only in the event of an actual power-down. Accordingly, it would be desirable to provide an improved power-on reset circuit which avoids the generation of a reset signal due to transient noise after the power supply voltage has exceeded the predetermined level. Further, in order to reduce the amount of space required, it would be expedient to have the power-on reset circuit formed as a part of the same monolithic semiconductor integrated circuit chip containing the digital logic devices.

SUMMARY OF THE INVENTION

Accordingly, it is a general object of the present invention to provide an improved CMOS power-on reset circuit which is relatively simple and economical to manufacture and assemble, but yet overcomes the problems encountered in the prior art reset circuits.

It is an object of the present invention to provide an improved CMOS power-on reset circuit which includes hysteresis switching means for turning off a reset signal when a first predetermined trip level has been reached and for turning on the reset signal when a second predetermined trip level has been reached and which is lower than the first preset trip level.

It is another object of the present invention to provide an improved CMOS power-on reset circuit which includes voltage clamping means responsive to a power supply voltage for generating a first control voltage and hysteresis switching means responsive to the power supply voltage and the first control voltage for generating a second control voltage which is used to turn off the reset signal when a first predetermined trip level has been reached and for turning on the reset signal when a second predetermined trip level has been reached and which is lower than the first predetermined trip level.

It is still another object of the present invention to provide an improved CMOS power-on reset circuit which is formed as a part of the same monolithic semiconductor integrated circuit chip containing logic and/or memory devices.

In accordance with these aims and objectives, the present invention is concerned with the provision of a CMOS power-on reset circuit for generating a reset signal in response to the activation of a power supply voltage. The power-on reset circuit includes a voltage clamping circuit and a hysteresis switching circuit. A power supply terminal is provided to receive a power supply voltage. The voltage clamping circuit is responsive to the power supply voltage for generating a first control voltage.

The hysteresis switching circuit is responsive to the power supply voltage and the first control voltage for generating a second control voltage which is used to turn off the reset signal at an output node when a first predetermined trip level has been exceeded and for turning on the reset signal when a second predetermined trip level has been reached and which is lower than the first predetermined trip level.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
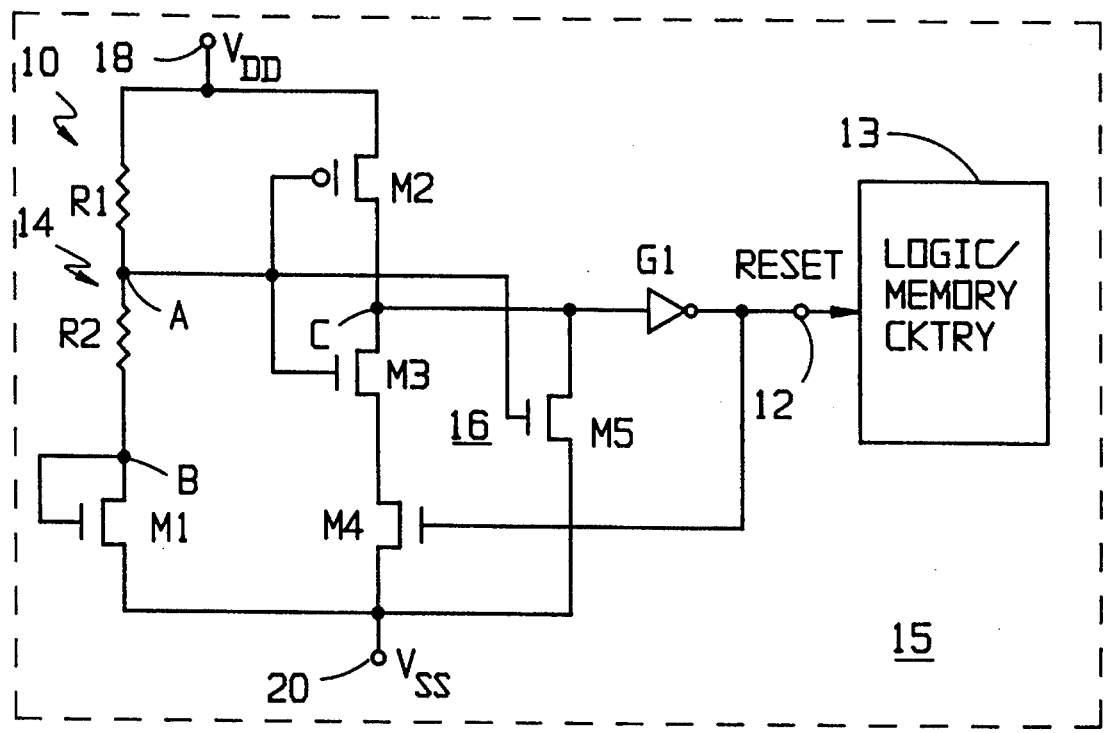
FIG. 1 is a schematic circuit diagram of a CMOS power-on reset circuit, constructed in accordance with the principles of the present invention.

Referring now in detail the drawings, there is shown in FIG. 1 a schematic circuit diagram of an improved CMOS power-on reset circuit 10 which is constructed in accordance with the principles of the present invention. The reset circuit 10 provides a reset signal RESET on its output terminal 12 which is connectable to various digital logic and/or memory devices 13. These digital logic and/or memory devices 13 are formed as a part of the same monolithic semiconductor integrated circuit chip 15. This reset signal RESET is a logic signal and initiates a reset to the digital logic and/or memory circuits 13 when it is at a high logic level (active state). On the other hand, the reset is inactive or turned off from the devices when the reset signal RESET is at a low logic level.

The reset circuit 10 includes a voltage clamping stage 14 and a hysteresis switching stage 16. The voltage clamping stage 14 is comprised of a first resistor R1, a second resistor R2, and a first N-channel MOS transistor M1. The first resistor R1 has its one end connected to a first power supply terminal 18 for receiving a power supply voltage or potential VDD. The other end of the resistor R1 is connected to one end of the resistor R2 and to a first internal node A. The other end of the resistor R2 is connected to a second internal node B. The gate and drain electrodes of the N-channel transistor M1 are connected together and to the node B. The source electrode of the transistor M1 is connected to a second power supply terminal 20 for receiving a second power supply voltage or potential VSS (which is typically at a ground potential or zero volts).

Initially, the power supply voltage VDD is turned off and both of the internal nodes A and B in the voltage clamping stage 14 are at the ground potential. When the reset circuit 10 is powered up from an inactive or off state, the power supply potential VDD does not immediately obtain its nominal level (i.e., +3 volts), but it will rather ramp up to this steady-state level. It should be noted that the ramp time for typical power supplies vary and is somewhere in the range of approximately one-tenth of a microsecond (0.1 μS) and one hundred milliseconds (100 mS).

The hysteresis switching stage 16 is comprised of a P-channel MOS pull-up transistor M2, a first N-channel pull-down MOS transistor M3, a current-source N-channel MOS transistor M4, a second pull-down N-channel MOS transistor M5, and an inverter G1. The P-channel transistor M2 has its source electrode connected to the first power supply terminal 18, its gate electrode connected to the first internal node A, and its drain electrode connected to the third internal node C. The first pull-down transistor M3 has its drain electrode connected to the drain electrode of the pull-up transistor M2, to the third internal node C, and to the drain electrode of the second pull-down transistor M5. The gate electrode of the pull-down transistor M3 is connected to the gate electrodes of the transistors M2, M5 and to the first internal node A. The source electrode of the pull-down transistor M3 is connected to the drain electrode of the current-source transistor M4.

The source electrode of the current-source transistor M4 is connected to the second power supply terminal 20 and to the source electrode of the second pull-down transistor M5. The drain electrode of the second pull-down transistor M5 is also connected to the input of inverter G1. The output of the inverter G1 provides the reset signal RESET to the logic/ memory circuitry 13 via the output terminal 12. The output of the inverter G1 is also connected to the gate of the current-source transistor M4.

Figure 2:
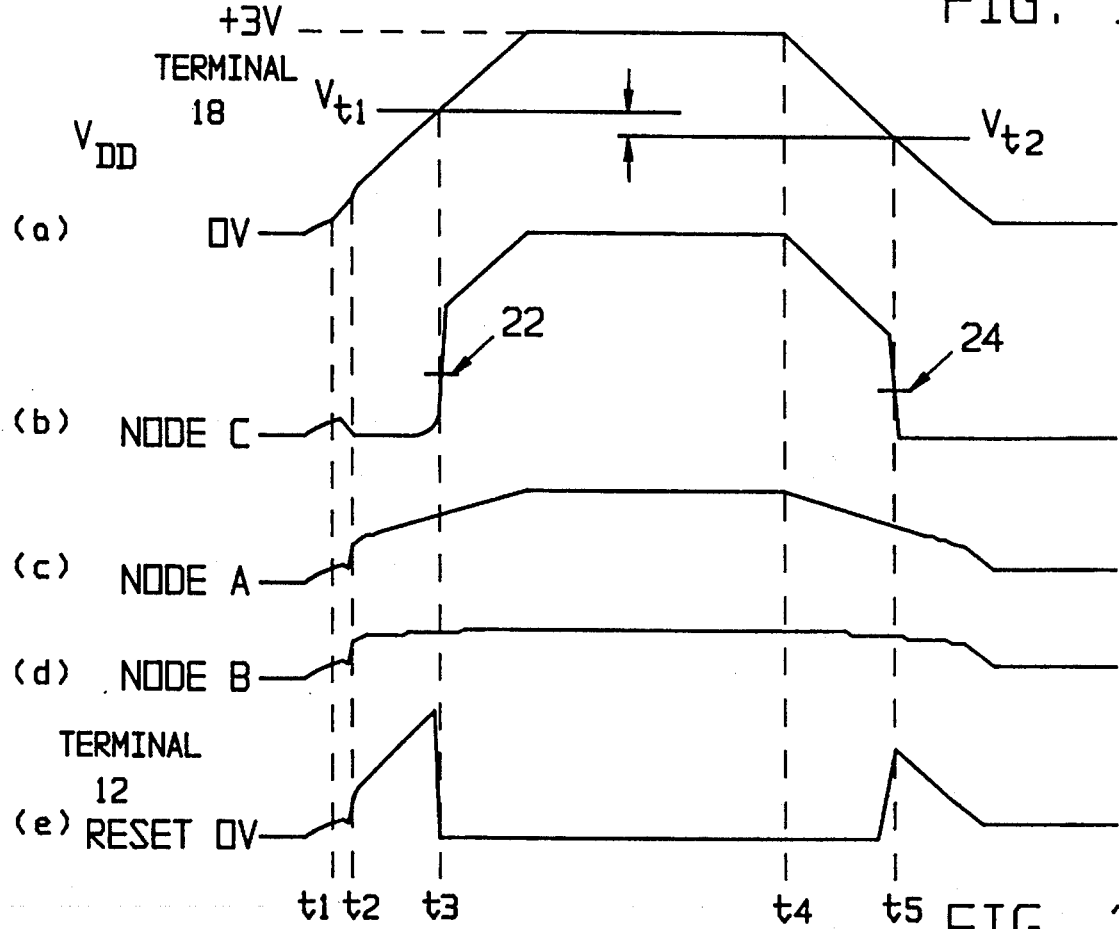
FIGS. 2(a) through 2(e) are waveforms at various points in the circuit of FIG. 1, which are useful in understanding the operation thereof.

In order to provide an understanding of the operation of the CMOS power-on reset circuit 10 of the present invention, reference is now made to FIGS. 2(a) through 2(e) of the drawings which illustrate waveforms appearing at various points in the reset circuit of FIG. 1. Initially, it is assumed that prior to time t1 the power supply voltage VDD applied to the power supply terminal 18 is in the turned-off condition or inactive state. As a consequence, all of the transistors M1 through M5 are non-conducting and the reset signal RESET will be low (i.e., zero volts) at the time t1. The power supply voltage VDD is shown in FIG. 2(a), and the reset signal RESET is shown in FIG. 2(e). Further, the nodes A, B and C are at a low or logic "zero" level (VSS), as depicted in respect to FIGS. 2(c), 2(d) and 2(b).

When the power supply voltage VDD is powered up or turned on at the time t1, the voltage level at the first power supply terminal 18 will begin ramping up towards its normal level, in this case +3.0 volts. The node A will also begin to rise and follows the power supply voltage VDD since the threshold of the transistor M1 has not been exceeded and thus there is no conduction through the resistors R1 and R2. The transistor M1 will remain turned off until the time t2 when the voltage level at the node B begins to exceed the threshold voltage of the transistor M1. At the time t2, the transistor M1 will be rendered conductive so that the node B as shown in FIG. 2(d) will be clamped. Further, the node A as illustrated in FIG. 2(c) will thereafter increase at a slower rate relative to the power supply potential VDD, as this slower rate of rise is controlled by the voltage divider formed by the resistors R1 and R2. It will be noted that the power supply voltage after the time t2 will continue to rise up towards the normal level.

At this same time t2, the second pull-down transistor M5 will also be turned on so as to maintain a low impedance at the node C. As can be seen in FIG. 2(b), the voltage at the node C is approximately zero volts. Thus, the output of the inverter G1 will be at a high level or state, which corresponds to the reset signal RESET. The reset signal will now begin to follow the power supply voltage VDD. As the power supply voltage VDD continues to ramp up after the time t2, the transistor M2 will be rendered more and more conductive due to the increasing gate-to-source voltage $V_{gs}$ so as to cause more current to flow into the transistors M5 and M3. As a result, the drain-to-source voltage $V_{ds}$ across the transistors M5 and M3 will be increased. This will, in turn, cause the node C to follow the power supply voltage VDD to rise until it reaches the switching threshold voltage at point 22 of the inverter G1 at time t3. As should be apparent to those skilled in the art, the threshold voltage of the inverter G1 is approximately equal to VDD/2.

At this time t3, the output of the inverter G1 will go low so as to switch off the reset signal RESET, which will cause the transistor M4 to turn off. As the transistor M4 is turned off this causes the node C to rise to the power supply potential VDD since it will now have a high impedance. Therefore, the current flowing into the transistor M3 will now be added to the transistor M5. Moreover, it will be noted that at the time t3 the power supply voltage will have reached a certain voltage defining a first predetermined trip level $V_{t1}$. Thereafter, the voltage at the node C will follow the power supply voltage VDD. This condition will remain unchanged in the normal operating range when the power supply voltage VDD is at +3.0 volts.

In the event of a power-down mode, when the power supply voltage VDD begins to decrease, such as at time t4, the reset signal RESET will not return back to the high level again until the voltage at the node C decreases below the switching threshold voltage at point 24 of the inverter G1. As can be seen, at time t5 the reset signal RESET will be returned to the high logic level, which in turn renders the transistor M4 conductive. As a result, the impedance at the node C will become low and thus will be at the ground potential. Again, it will be noted that at the time t5 the power supply voltage VDD has decreased to a certain voltage defining a second predetermined trip point $V_{t2}$.

This second predetermined trip level $V_{t2}$ is substantially lower than the first predetermined trip level $V_{t1}$. The difference in the voltage levels between the first trip voltage and the second trip voltage is referred to as "VDD hysteresis voltage." This built-in hysteresis serves to provide a certain noise margin for the power supply voltage VDD so as to prevent the generation of an unwanted reset signal which interferes with the normal operation of the logic devices. In other words, this hysteresis voltage serves to prevent activating a reset signal when the power supply voltage VDD decreases due to transient noise rather than an actual power-down mode of operation.

It should be appreciated that the voltage clamping stage 14 of the present CMOS reset circuit 10 is utilized to establish a first control voltage at the internal node A in response to the power supply voltage VDD by connecting the N-channel transistor M1 in series with the voltage divider formed by the resistors R1 and R2. While the transistor M1 functions to maintain the advantage of tracking with the other transistors, the voltage divider is used to establish a fraction of the threshold voltage of the N-channel transistor M1 at the internal node A so as to provide a low power supply voltage VDD operation. Further, it should be clearly understood that the hysteresis switching stage 16 is responsive to the power supply voltage VDD and the first control voltage so as to generate the second control voltage at the internal node C. It is this second control voltage which causes the switching of the inverter G1. It should be apparent to those skilled in the art that the second predetermined trip level is determined by the relative sizes of the transistors M2 through M5.

In a preferred embodiment of the invention, the ratio of the values of the resistors R1 to R2 is chosen to be 2:1 and the pull-down transistor was operated in the sub-threshold region. As a result, it was found that the highest value for the first predetermined trip level $V_{t1}$ to be approximately +2.7 V and that the VDD hysteresis voltage was 0.4 V nominal. This was found to be quite suitable for the desired power supply voltage operation of +3.0 volts. It should also be understood that the CMOS reset circuit 10 may be formed as a part of the same semiconductor integrated circuit chip 15 containing the logic devices 13, thereby reducing the amount of chip area required.

From the foregoing detailed description, it can thus be seen that the present invention provides an improved CMOS power-on reset circuit which includes a hysteresis switching circuit for turning off the reset signal after a first predetermined trip level has been reached and for turning on the reset signal after a second predetermined trip level has been reached and which is lower than the first predetermined trip level. Further, the reset circuit may be formed as a part of the same semiconductor integrated circuit chip containing logic gate devices.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A CMOS power-on reset circuit for generating a reset signal in response to the activation of a power supply voltage, said reset circuit comprising:

a power supply terminal (18) for receiving a power supply voltage (VDD);

voltage clamping means (14) responsive to said power supply voltage (VDD) for generating a first control voltage;

said voltage clamping means including an N-channel transistor (M1), a first resistor (R1), and a second resistor (R2);

said first resistor having its one end connected to the power supply terminal and its other end connected to one end of said second resistor at a first internal node (A) to provide the first control voltage, said N-channel transistor (M1) having its drain and gate electrodes connected together and to the other end of said second resistor, said N-channel transistor (M1) having its source electrode connected to a ground potential (VSS); and hysteresis switching means responsive to said power supply voltage (VDD) and said first control voltage for generating a second control voltage which is used to turn off a reset signal at an output node when a first predetermined trip level has been exceeded and for turning on said reset signal when a second predetermined trip level has been reached which is lower than said first predetermined trip level.

2. A reset circuit as claimed in claim 1, wherein said hysteresis switching means includes a P-channel pull-up transistor (M2), a first N-channel pull-down transistor (M3), a current-source transistor (M4), a second N-channel pull-down transistor (M5), and an inverter (G1).

3. A reset circuit as claimed in claim 2, wherein said P-channel transistor (M2) has its source electrode connected to the power supply terminal (18), its gate electrode connected to the first internal node (A), and its drain electrode connected to a second internal node (C) to provide the second control signal, said first N-channel pull-down transistor (M3) having its drain electrode connected to the second internal node (C) and its gate electrode connected to the first internal node (A), said current-source transistor (M4) having its drain electrode connected to the source of said first N-channel pull-down transistor (M3), its gate electrode connected to the output of said inverter (G1), and its source electrode connected to the ground potential (VSS), said second N-channel pull-down transistor (M5) having its drain connected to the second internal node (C), its gate electrode connected to the first internal node (A), and its source electrode connected to the ground potential, said inverter (G1) having its input connected also to the second internal node (C) and its output connected to the output terminal (12) to provide the reset signal.

4. A reset circuit as claimed in claim 3, further comprising at least one of logic and memory devices (13) being formed on a single monolithic semiconductor integrated circuit chip (15) and being responsive to said reset signal.

5. A reset circuit as claimed in claim 4, wherein said reset circuit (10) is formed as a part of the same integrated circuit chip (15) containing the at least one of logic and memory devices (13).

6. A reset circuit as claimed in claim 1, further comprising at least one of logic and memory devices (13) being formed on a single monolithic semiconductor integrated circuit chip (15) and being responsive to said reset signal.

7. A reset circuit as claimed in claim 6, wherein said reset circuit (10) is formed as a part of the same integrated circuit chip (15) containing the at least one of logic and memory devices (13).

8. A CMOS power-on reset circuit for generating a reset signal in response to the activation of a power supply voltage, said reset circuit comprising:

a power supply terminal (18) for receiving a power supply voltage (VDD);

voltage clamping means (14) responsive to said power supply voltage (VDD) for generating a first control voltage;

said voltage clamping means including an N-channel transistor (M1), a first resistor (R1), and a second resistor (R2);

said first resistor having its one end connected to the power supply terminal and its other end connected to one end of said second resistor at a first internal node (A) to provide the first control voltage, said N-channel transistor (M1) having its drain and gate electrodes connected together and to the other end of said second resistor, said N-channel transistor (M1) having its source electrode connected to a ground potential (VSS);

hysteresis switching means responsive to said power supply voltage (VDD) and said first control voltage for generating a second control voltage which is used to turn off a reset signal at an output node when a first predetermined trip level has been exceeded and for turning on said reset signal when a second predetermined trip level has been reached which is lower than said first predetermined trip level;

said hysteresis switching means including a P-channel pull-up transistor (M2), a first N-channel pull-down transistor (M3), a current-source transistor (M4), a second N-channel pull-down transistor (M5), and an inverter (G1);

said P-channel transistor (M2) having its source electrode connected to the power supply terminal (18), its gate electrode connected to the first internal node (A), and its drain electrode connected to a second internal node (C) to provide the second control signal, said first N-channel pull-down transistor (M3) having its drain electrode connected to the second internal node (C) and its gate electrode connected to the first internal node (A), said current-source transistor (M4) having its drain electrode connected to the source of said first N-channel pull-down transistor (M3), its gate electrode connected to the output of said inverter (G1), and its source electrode connected to the ground potential (VSS), said second N-channel pull-down transistor (M5) having its drain connected to the second internal node (C), its gate electrode connected to the first internal node (A), and its source electrode connected to the ground potential, said inverter (G1) having its input connected also to the second internal node (C) and its output connected to the output terminal (12) to provide the reset signal; and logic and/or memory devices (13) operatively connected to the power supply voltage and said reset signal and being responsive thereto.

9. A reset circuit as claimed in claim 8, further comprising at least one of logic and memory devices (13) being formed on a single monolithic semiconductor integrated circuit chip (15).

10. A reset circuit as claimed in claim 9, wherein said reset circuit (10) is formed as a part of the same integrated circuit chip (15) containing the at least one of logic and memory devices (13).

* * * * *